(12) United States Patent
Bechtel et al.

(10) Patent No.: US 9,214,609 B2
(45) Date of Patent: Dec. 15, 2015

(54) LED ASSEMBLY COMPRISING A LIGHT SCATTERING LAYER

(75) Inventors: Hans Helmut Bechtel, Eindhoven (NL); Thomas Diederich, Eindhoven (NL); Matthias Heidemann, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 15 days.

(21) Appl. No.: 13/976,479

(22) PCT Filed: Jan. 24, 2012

(86) PCT No.: PCT/IB2012/050322
§ 371 (c)(1),
(2), (4) Date: Jun. 27, 2013

(87) PCT Pub. No.: WO2012/104744
PCT Pub. Date: Aug. 9, 2012

(65) Prior Publication Data
US 2013/0299865 A1    Nov. 14, 2013

(30) Foreign Application Priority Data

Feb. 1, 2011    (EP) ..................................... 11152838

(51) Int. Cl.
*H01L 33/00*    (2010.01)
*H01L 21/00*    (2006.01)
*H01L 33/50*    (2010.01)
*H01L 33/44*    (2010.01)

(52) U.S. Cl.
CPC ................ *H01L 33/50* (2013.01); *H01L 33/44* (2013.01); *H01L 2933/0091* (2013.01)

(58) Field of Classification Search
CPC ... H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
USPC ........ 257/13, 79–103, 918, 40, 642–643, 759
See application file for complete search history.

(56) References Cited

U.S. PATENT DOCUMENTS

2008/0079015 A1    4/2008  Krummacher
2009/0278147 A1 *  11/2009 Suzuki ............................ 257/98

FOREIGN PATENT DOCUMENTS

| EP | 2323184 A1 | 5/2011 |
| WO | 2010064177 A1 | 6/2010 |
| WO | 2010134011 A2 | 11/2010 |
| WO | 2011007276 A1 | 1/2011 |

* cited by examiner

*Primary Examiner* — Selim Ahmed
*Assistant Examiner* — Moin Rahman (57) ABSTRACT

The invention relates to a LED assembly comprising a light scattering layer provided between the phosphor layer of the LED and a filter layer.

11 Claims, 7 Drawing Sheets

LED ASSEMBLY COMPRISING A LIGHT SCATTERING LAYER

FIELD OF THE INVENTION

The present invention relates to the field of light emission diode (LED) assemblies. Particularly the invention relates to enhanced uniform emission phosphor-converting LED light assemblies (pcLED). Such assemblies are often employed to provide white light

BACKGROUND OF THE INVENTION

White light emitting LEDs generally comprise a blue emitting LED combined with a phosphor layer that is stimulated by the blue emission of the LED into emitting yellow/red light, the combination of the yellow/red and blue emissions providing a white light. For normal direction, vertical to the surface of the LED die or vertical to the surface of the phosphor layer with an emission angle of 0°, the direct path length (not scattered) in the phosphor layer of the light rays emitted by the blue emitting LED is equal to the thickness of the phosphor layer. For increasing emission angles the direct path length for blue light rays increases. Accordingly the fraction of absorbed blue light rays by the phosphor layer is lower for the light rays with an emission angle of 0° than for the light rays with an increasing emission angle. Since the converted light emitted by the phosphor layer always has an almost Lambertian over angle distribution, the white light emitted by the LED contains more blue light emitted by the LED leading to a higher correlated color temperature for small emission angles around normal emission with an emission angle of about 0-30°. Generally, the phosphor layer is a $Y_3Al_5O_{12}$:$Ce^{3+}$ (YAG:Ce). In case of such a YAG:Ce phosphor layer emitted light becomes yellowish with increasing emission angle, perceived as yellow ring. To solve the yellow ring problem it is known to increase the scattering power of the phosphor layer and/or to add a scattering layer on top of the phosphor layer. For both, the reduction of the yellow ring problem results in a reduction of the LED efficiency, since scattering is accompanied by light reflection leading to light losses. In particular, scattering of the down-converted phosphor emission leads to reflection with accompanied reflection losses.

E.G. in the European patent application 09175903 a filter layer is introduced which comprises alternating layers of a high-refractive and a lower-refractive material.

However, there is still the continuing need for further improvement of LED assemblies to further overcome the above-mentioned drawbacks and to provide a more uniform emittance profile of the LED assembly.

SUMMARY OF THE INVENTION

It is an object of the present invention to provide a LED assembly which furthermore improves the uniform emittance profile of the LED.

This object is solved by a LED assembly according to claim 1 of the present invention. Accordingly, a LED assembly is provided comprising a LED die, a phosphor layer, a filter layer and a light scattering layer provided between the phosphor layer and the filter layer in the path of the light emitted by the LED die, whereby the difference in refractive index $\Delta n$ between the light scattering layer and the material of the filter layer adjacent to the light scattering layer is $\Delta n \geq 0.2$, preferably $\Delta n \geq 0.3$ and;

the difference in refractive index $\Delta n$ between the light scattering layer and the material of the layer adjacent to the light scattering layer in the direction of the LED is $\Delta n \geq 0.2$, preferably $\Delta n \geq 0.3$.

and the product of the thickness of the light scattering layer D and the refractive index n of the light scattering layer is 1900 nm$\geq$n*D$\geq$400 nm.

The LED die according to the present invention is preferably a blue emitting LED although this is not limiting.

The layer adjacent to the light scattering layer in the direction of the LED may in some applications of the invention be a phosphor layer, however, in other applications this layer may be e.g. a glass layer provided between a phosphor layer and the light scattering layer.

A phosphor layer according to the present invention comprises preferably one or more red to green emitting materials which absorb light from the LED die. A preferred phosphor layer material is e.g. $Lu_{1.5}Y_{1.5}Al_5O_{12}$:$Ce^{3+}$ (LuYAG:Ce) although this is not limiting and any suitable material known to the skilled person in the art may be used.

The term "filter layer" according to the present invention preferably comprises a dielectric filter layer. Preferably the filter layer is developed in such a manner that light rays with a wavelength of about 400 nm to 500 nm, preferably of about 420 nm to 490 nm, emitted from the LED die are at least partially reflected depending on their emission angle to the normal on the filter layer. It should be noted that the filter layer may comprise several sub-layers (actually this is one preferred embodiment of the present invention as will be described in more detail later on) so the term "layer" in this context is not intended to be limiting in that sense that this layer consists out of one material only. Preferably the filter layer is chosen from the layers described in the European patent application 09175903 which is hereby incorporated by reference. Especially it is preferred that the filter layer comprises a dielectric layer coating of alternating low and high reflective index materials.

The term "light scattering layer" especially means and/or comprises a layer which is capable of scattering incident light and which nevertheless has a good transparency. Preferably, light is scattered only at the interfaces of the scattering layer with the adjacent conversion layer and the filter layer by refraction at the interfaces.

Such a LED assembly has shown for a wide range of applications within the present invention to have at least one of the following advantages Using the light scattering layer, the package efficiency is increased for desired color over angle uniformity.

A wider range of surface roughness of the conversion layer or substrate layer can be used.

The LED assembly shows an improved color targeting capability.

According to a preferred embodiment of the invention, the product of the thickness of the light scattering layer D and the refractive index n of the light scattering layer is 1600 nm$\geq$n*D$\geq$900 nm, more preferably 1400 nm$\geq$n*D$\geq$1000 nm and most preferred 1200 nm$\geq$n*D$\geq$1100 nm. This has been shown in practice to furthermore increase the capability of the light scattering layer.

However, for most applications (depending on the material chosen as the light scattering layer) it may be preferred that the thickness D of the light scattering layer is 800 nm$\geq$D$\geq$300 nm (i.e. regardless of the refractive index). A higher thickness may lead to problems in the manufacturing process of the light scattering layer, a lower thickness may lead to a dramatic decrease in performance. More preferably the thickness D of the light scattering layer is 700 nm≥D≥400 nm, more preferred 600 nm≥D≥500 nm.

According to a preferred embodiment of the invention, whereby the material of the light scattering layer is essentially chosen from the group comprising inorganic oxides, preferably from the group comprising $ZrO_2$, $Y_2O_3$, $Ta_2O_5$, $Nb_2O_5$, $SiO_2$, $TiO_2$, $Al_2O_3$, $HfO_2$, or mixtures thereof. These materials have proven themselves in practice due to their transparency as well as desirable refractive indices.

The term "essentially" means especially ≥95%, preferably ≥97% and most preferred ≥99% wt-%. However, in some applications, trace amounts of additives may also be present in the bulk compositions. These additives also include transition metal elements, which might be applied to introduce dedicated light absorption properties of the layers.

The present invention furthermore relates to a system comprising a LED assembly according to the present invention, being used in one or more of the following applications:
  Office lighting systems
  household application systems
  shop lighting systems,
  home lighting systems,
  accent lighting systems,
  spot lighting systems,
  theater lighting systems,
  fiber-optics application systems,
  projection systems,
  self-lit display systems,
  pixelated display systems,
  segmented display systems,
  warning sign systems,
  medical lighting application systems,
  indicator sign systems, and
  decorative lighting systems
  portable systems
  automotive applications
  green house lighting systems The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

BRIEF DESCRIPTION OF THE DRAWINGS

Additional details, features, characteristics and advantages of the object of the invention are disclosed in the subclaims, the figures and the following description of the respective figures and examples, which—in an exemplary fashion—show several embodiments and examples of inventive LED assemblies according to the invention.

DETAILED DESCRIPTION OF THE EMBODIMENTS

Figure 1:
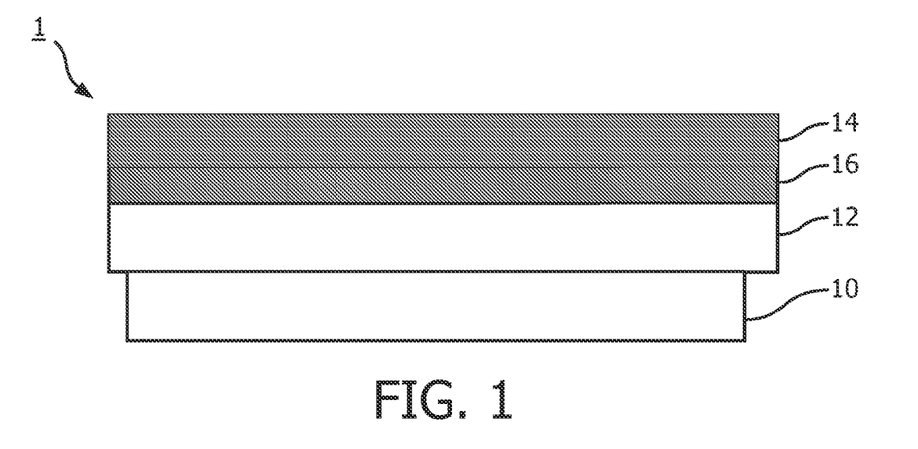
FIG. 1 shows a schematic cross-sectional view of a LED assembly according to one embodiment of the present invention.

FIG. 1 shows a schematic cross-sectional view of a LED assembly 1 according to one embodiment of the present invention. It consists of a LED die 10 (preferably a blue LED), whereby a phosphor layer 12, the light scattering layer 16 and a filter layer 14 are provided on top of the LED die 10.

Example I

The invention will further be understood by the following Example I which is merely for illustration and which is non-binding. According to Example I a light scattering layer as well as a filter layer (consisting of several sub-layers) were provided on a phosphor layer according to Table I.

Figure 2:
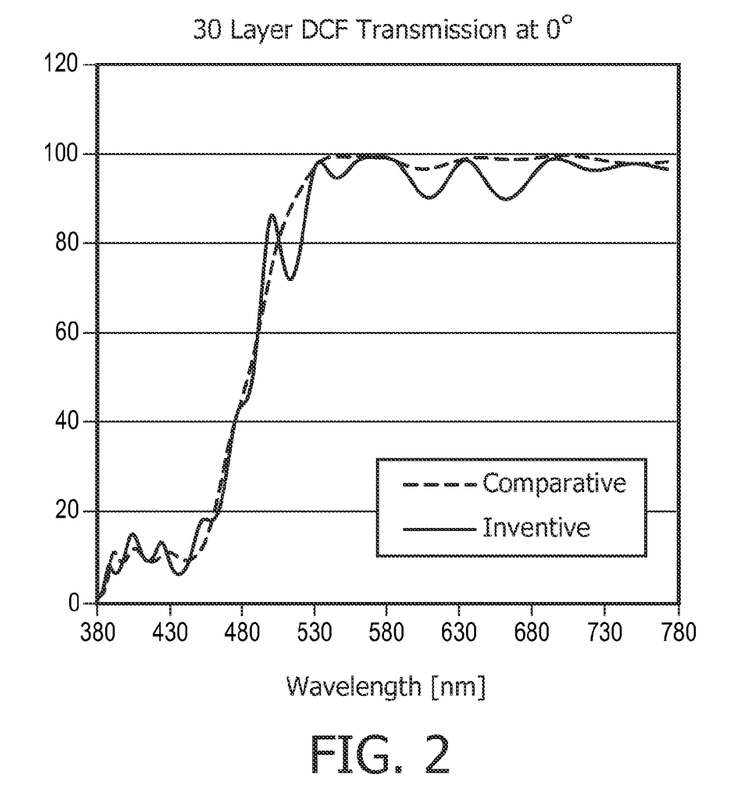
FIG. 2 shows the transmission at 0° as a function of the wavelength for a LED assembly according to Example I and one comparative Example.
Figure 3:
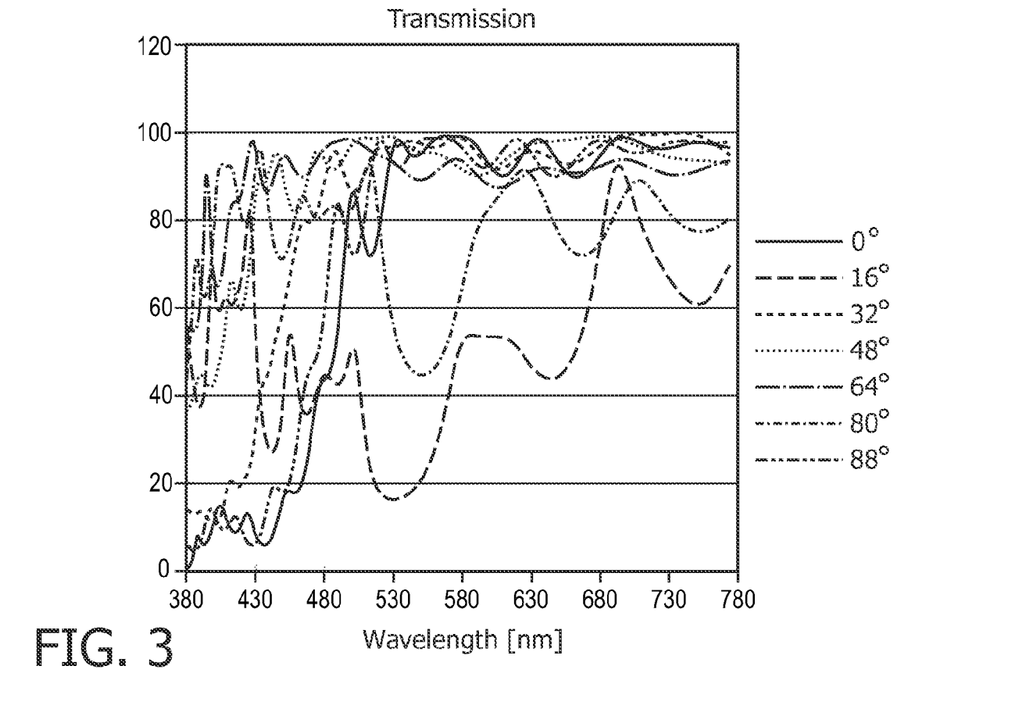
FIG. 3 shows several transmission spectra of the LED assembly according to Example I for different angles

As a comparative example a similar assembly was used without the light scattering layer. FIG. 2 shows the transmission at 0° vs. the wavelength for the assembly according to Example I (solid line) and the comparative Example (dashed line). It can clearly be seen that the inventive assembly shows some "nudges" and "edges" which show the improved scattering features. FIG. 3 shows several transmission spectra of the LED assembly according to Example I for different angles. Also here the improved properties of the inventive assembly can clearly be seen.

Example II

Figure 4:
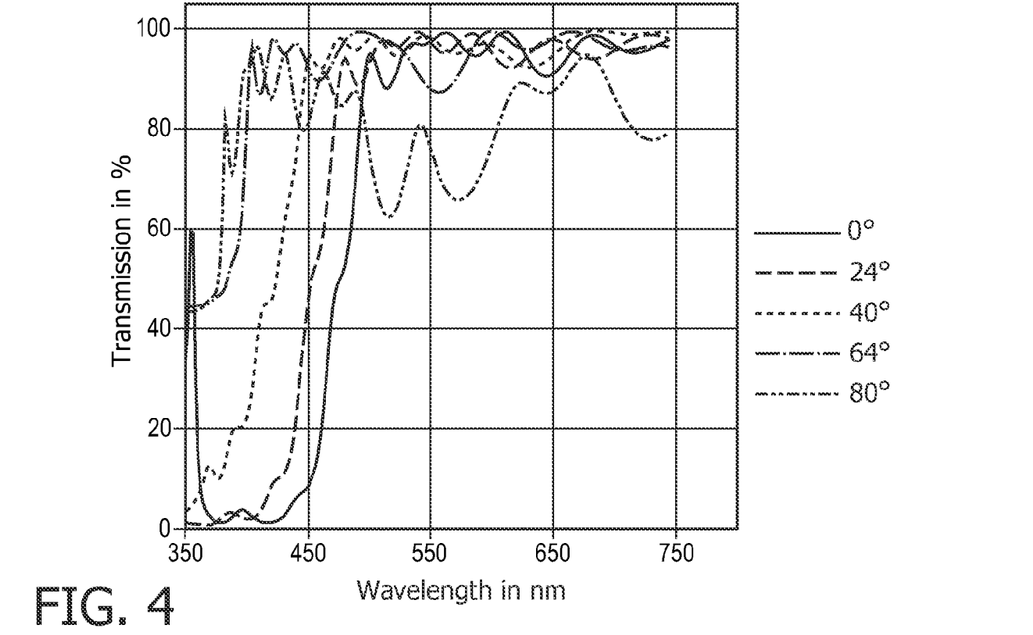
FIG. 4 shows several transmission spectra of the LED assembly according to Example II for different angles
Figure 5:
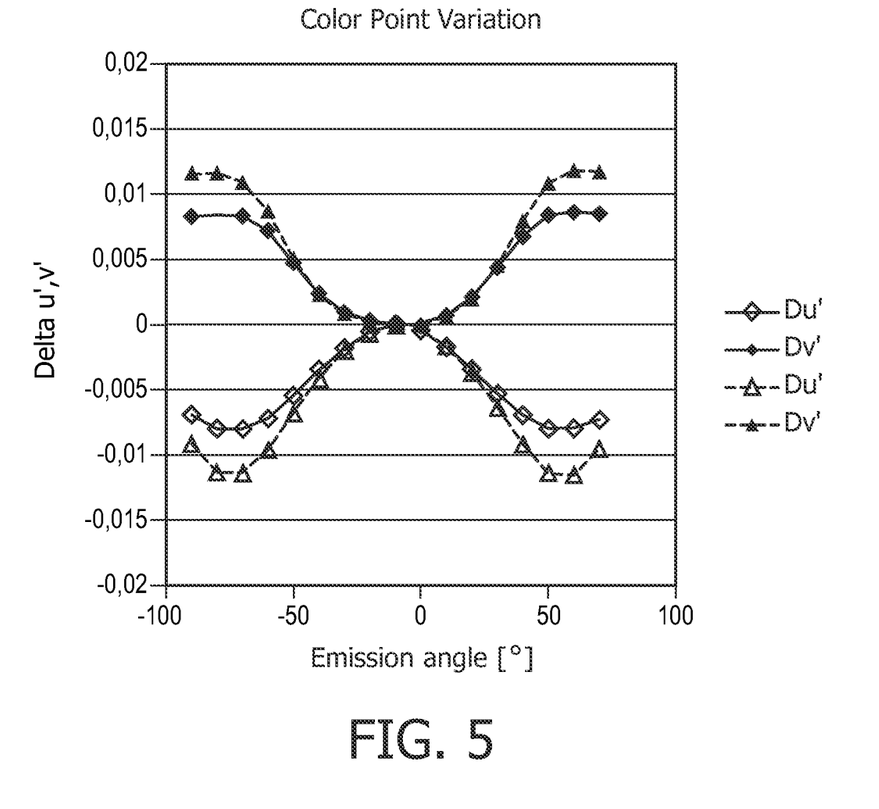
FIG. 5 shows a diagram depicting the color point variation as a function of the emission angle for the assembly according to Example II and a comparative example.

A second inventive assembly was made in similar fashion as Example I with the setup as defined in Table II FIG. 4 shows several transmission spectra of the LED assembly according to Example II for different angles, clearly (as in FIG. 3) the improved emittance profile is depicted. FIG. 5 shows a diagram depicting the color point variation (CIE 1796) as a function of the emission angle for the assembly according to Example II and a comparative example without the light scattering layer (warm white LEDs, CCT=2700K). Clearly it can be seen that the variation for the inventive example is much smaller.

Example III

Figure 6:
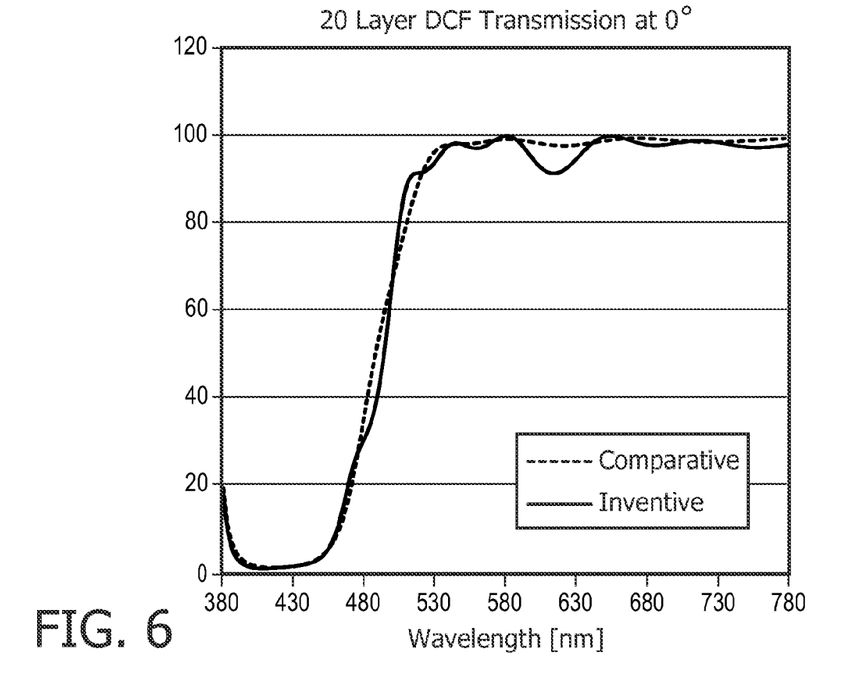
FIG. 6 shows the transmission at 0° as a function of the wavelength for a LED assembly according to Example III and one comparative Example.

A third inventive assembly was made in similar fashion as Example I and II with the setup as defined in Table III FIG. 6 shows the transmission at 0° vs. the wavelength for the assembly according to Example III (solid line) and a comparative Example without light scattering layer (dashed line). It can clearly be seen that the inventive assembly shows some "nudges" and "edges" which show the improved scattering features.

Example IV

Figure 7:
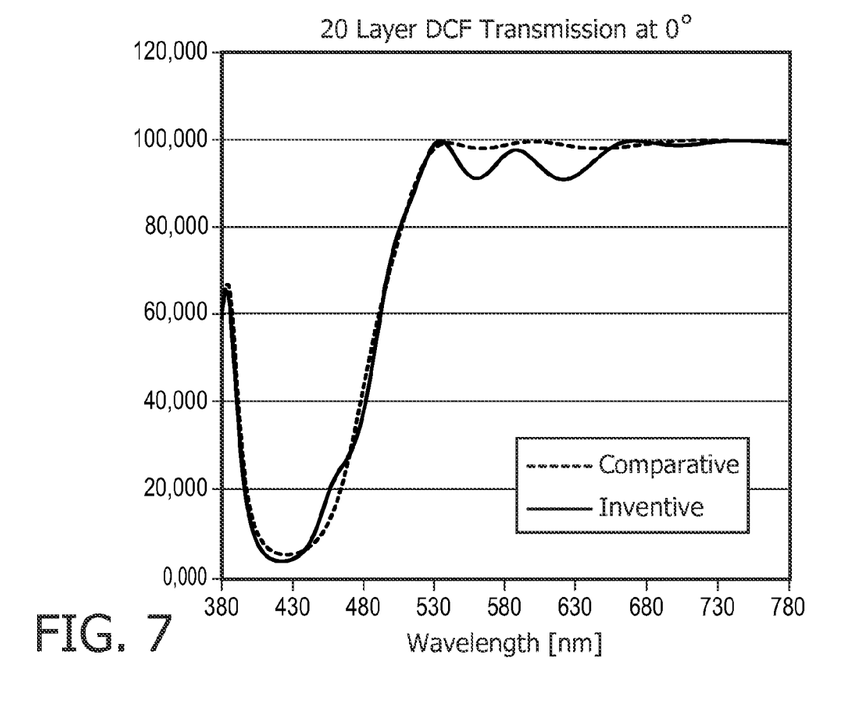
FIG. 7 shows the transmission at 0° as a function of the wavelength for a LED assembly according to Example IV and one comparative Example.

A fourth inventive assembly was made with the following setup: A glass substrate of 170 μm was sandblasted on one side to generate a surface of Ra=190 nm. A phosphor powder layer was deposited on a glass substrate in a silicone matrix, and the scattering layer together with the filter layers were deposited on the opposite side of the glass substrate. See Table IV for the details of the setup of Example IV FIG. 7 shows the transmission at 0° vs. the wavelength for the assembly according to Example IV (solid line) and a comparative Example without light scattering layer (dashed line). It can clearly be seen that the inventive assembly shows some "nudges" and "edges" which show the improved scattering features.

Example V

A fifth inventive assembly was made in similar fashion as Examples I to IV with the setup as defined in Table V.

Figure 8:
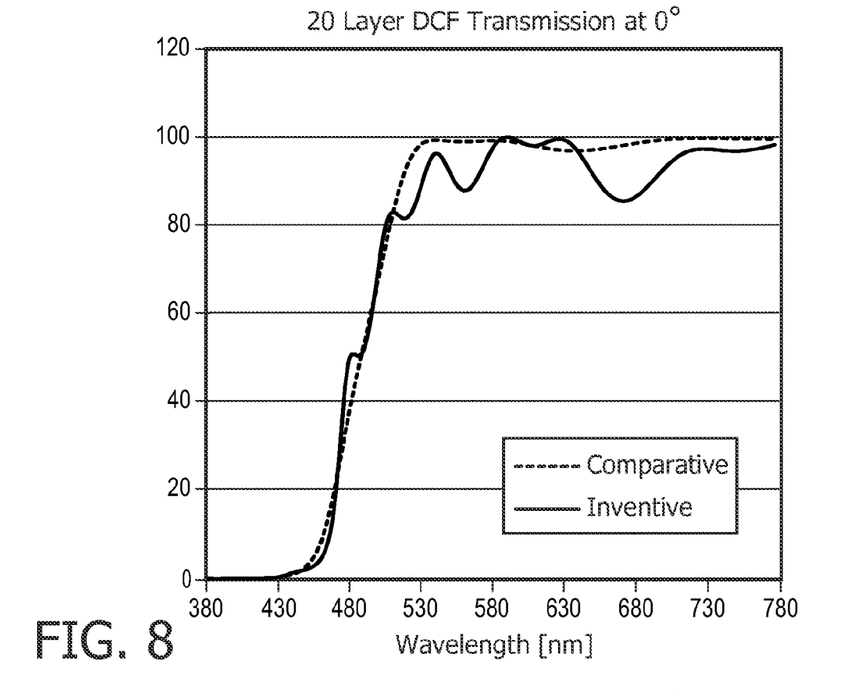
FIG. 8 shows the transmission at 0° as a function of the wavelength for a LED assembly according to Example V and one comparative Example.

FIG. 8 shows the transmission at 0° vs. the wavelength for the assembly according to Example V (solid line) and a comparative Example without light scattering layer (dashed line). It can clearly be seen that the inventive assembly shows some "nudges" and "edges" which show the improved scattering features.

Example VI

Figure 9:
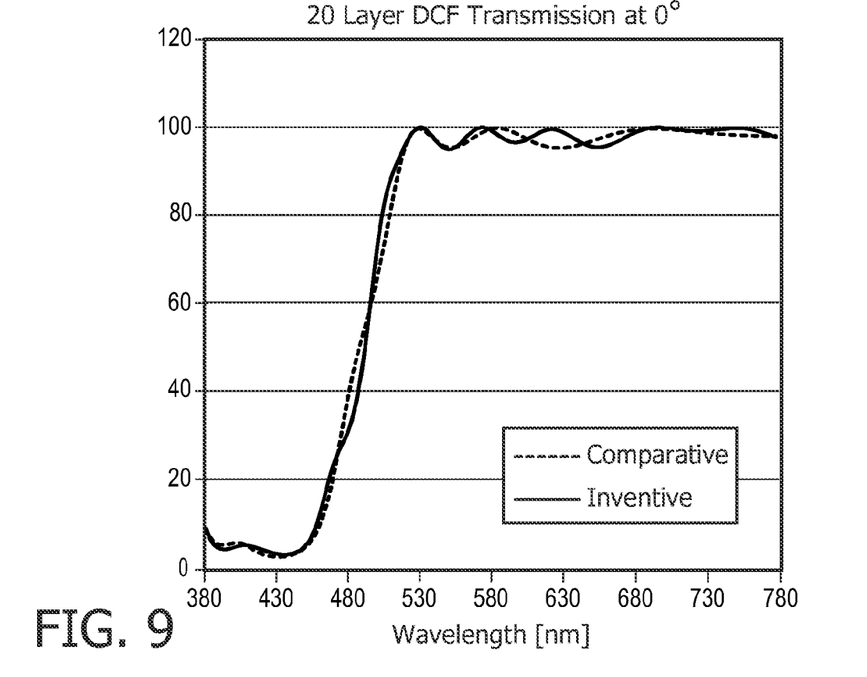
FIG. 9 shows the transmission at 0° as a function of the wavelength for a LED assembly according to Example VI and one comparative Example.

A sixth inventive assembly was made in similar fashion as Examples I to V with the setup as defined in Table VI FIG. 9 shows the transmission at 0° vs. the wavelength for the assembly according to Example VI (solid line) and a comparative Example without light scattering layer (dashed line). It can clearly be seen that the inventive assembly shows some "nudges" and "edges" which show the improved scattering features.

Example VII

A seventh inventive assembly was made in similar fashion as Examples I to VI with the setup as defined in Table VII.

Figure 10:
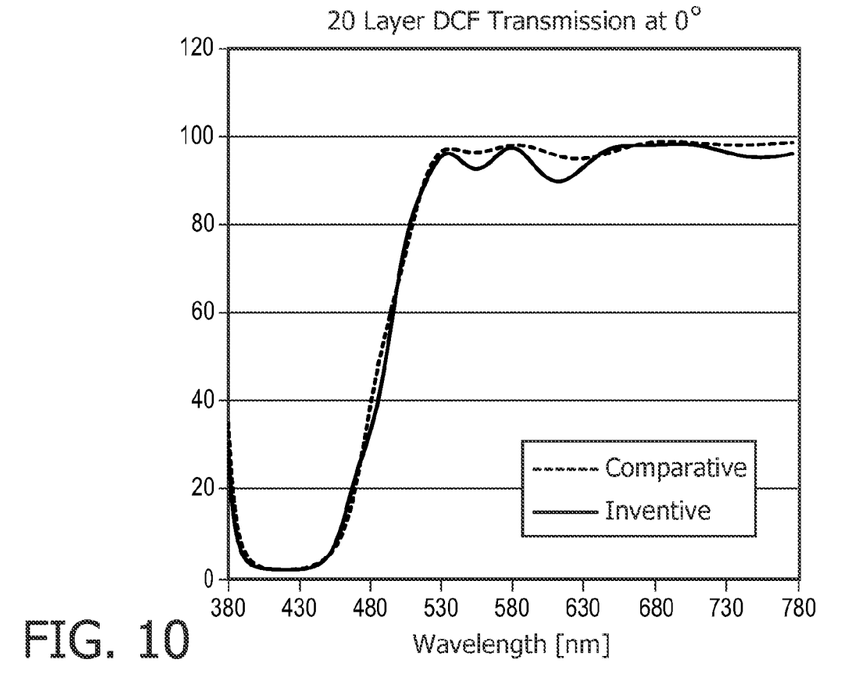
FIG. 10 shows the transmission at 0° as a function of the wavelength for a LED assembly according to Example VII and one comparative Example.

FIG. 10 shows the transmission at 0° vs. the wavelength for the assembly according to Example VII (solid line) and a comparative Example without light scattering layer (dashed line). It can clearly be seen that the inventive assembly shows some "nudges" and "edges" which show the improved scattering features.

Example VIII

A eighth inventive assembly was made in similar fashion as Examples I to VII with the setup as defined in Table VIII.

Figure 11:
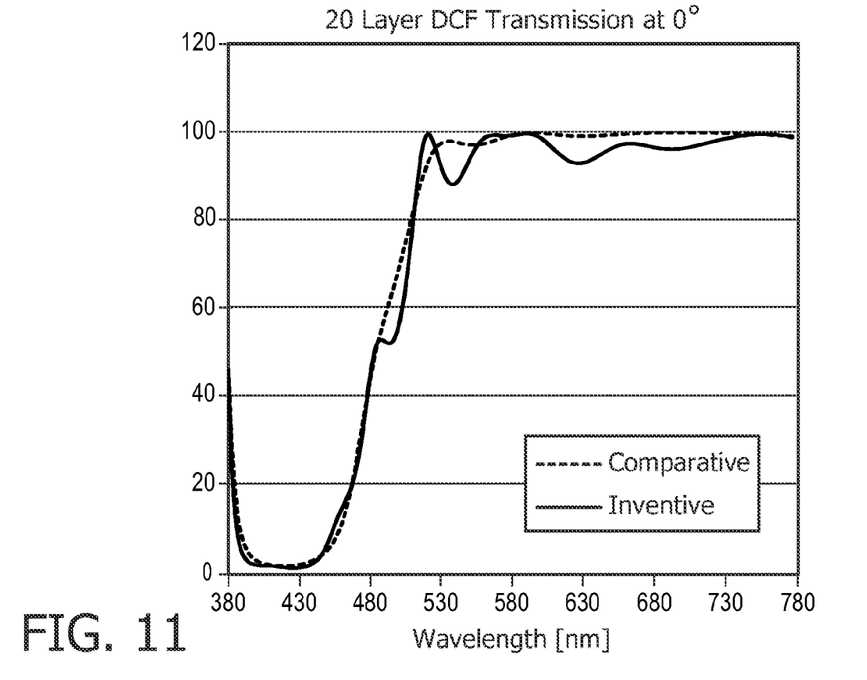
FIG. 11 shows the transmission at 0° as a function of the wavelength for a LED assembly according to Example VIII and one comparative Example.

FIG. 11 shows the transmission at 0° vs. the wavelength for the assembly according to Example VIII (solid line) and a comparative Example without light scattering layer (dashed line). It can clearly be seen that the inventive assembly shows some "nudges" and "edges" which show the improved scattering features.

Example IX

A ninth inventive assembly was made in similar fashion as Example II with the setup as defined in Table IX.

Figure 12:
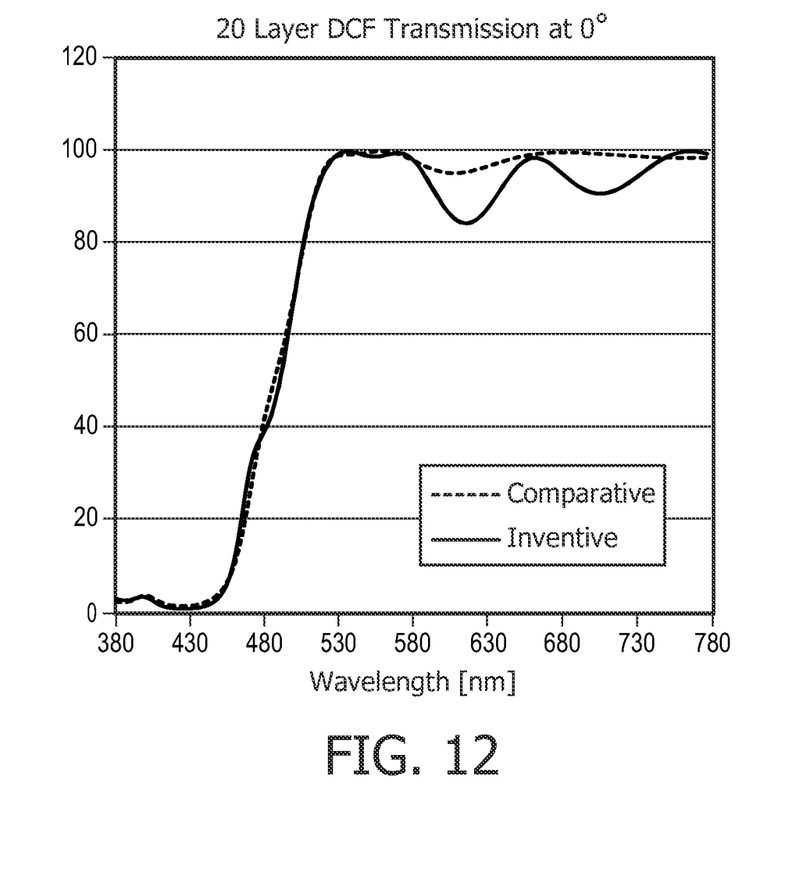
FIG. 12 shows the transmission at 0° as a function of the wavelength for a LED assembly according to Example IX and one comparative Example.

FIG. 12 shows the transmission at 0° vs. the wavelength for the assembly according to Example IX (solid line) and a comparative Example without light scattering layer (dashed line). It can clearly be seen that the inventive assembly shows some "nudges" and "edges" which show the improved scattering features.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

TABLE I setup of Example I

| Layer | Material | Thickness (nm) |
| --- | --- | --- |
| Substrate | (Lu,Y)AG__Lumiramic | |
| Light scattering layer | $Nb_2O_5$ | 500.0 |
| Filter layer: | | |
| 1 | $SiO_2$ | 49.81 |
| 2 | $Nb_2O_5$ | 15.22 |
| 3 | $SiO_2$ | 89.2 |
| 4 | $Nb_2O_5$ | 16.32 |
| 5 | $SiO_2$ | 79.14 |
| 6 | $Nb_2O_5$ | 20.78 |
| 7 | $SiO_2$ | 66.61 |
| 8 | $Nb_2O_5$ | 22.55 |
| 9 | $SiO_2$ | 65.03 |
| 10 | $Nb_2O_5$ | 23.32 |
| 11 | $SiO_2$ | 65.69 |
| 12 | $Nb_2O_5$ | 18.9 |
| 13 | $SiO_2$ | 81.22 |
| 14 | $Nb_2O_5$ | 13.95 |
| 15 | $SiO_2$ | 105.62 |
| 16 | $Nb_2O_5$ | 13.56 |
| 17 | $SiO_2$ | 92.85 |
| 18 | $Nb_2O_5$ | 24.83 |
| 19 | $SiO_2$ | 73.59 |
| 20 | $Nb_2O_5$ | 36.14 |
| 21 | $SiO_2$ | 62.09 |
| 22 | $Nb_2O_5$ | 35.67 |
| 23 | $SiO_2$ | 90.29 |
| 24 | $Nb_2O_5$ | 16.05 |
| 25 | $SiO_2$ | 161.65 |
| 26 | $Nb_2O_5$ | 19.28 |
| 27 | $SiO_2$ | 65.59 |
| 28 | $Nb_2O_5$ | 162.24 |
| 29 | $SiO_2$ | 72.25 |
| 30 | $Nb_2O_5$ | 15.19 |
| Exit medium | Silicone | |
| Total Thickness | | 2174.6 |

TABLE II setup of Example II

| Layer | Material | Thickness (nm) |
|---|---|---|
| Substrate | (Lu,YAG) | |
| Light scattering layer | $Nb_2O_5$ | 500 |
| Filter layers | $SiO_2$ | 37.34 |
| | $Nb_2O_5$ | 21.16 |
| | $SiO_2$ | 92.98 |
| | $Nb_2O_5$ | 11.69 |
| | $SiO_2$ | 127.85 |
| | $Nb_2O_5$ | 7.82 |
| | $SiO_2$ | 117.87 |
| | $Nb_2O_5$ | 22.37 |
| | $SiO_2$ | 71.8 |
| | $Nb_2O_5$ | 42.3 |
| | $SiO_2$ | 46.24 |
| | $Nb_2O_5$ | 49.63 |
| | $SiO_2$ | 69.84 |
| | $Nb_2O_5$ | 24.68 |
| | $SiO_2$ | 132 |
| | $Nb_2O_5$ | 24.15 |
| | $SiO_2$ | 57.98 |
| | $Nb_2O_5$ | 159.48 |
| | $SiO_2$ | 73.98 |
| | $Nb_2O_5$ | 12.95 |
| Exit medium | Silicone | |
| Total Thickness | | 1704.12 |

TABLE III setup of Example III

| Layer | Material | Thickness (nm) |
|---|---|---|
| Substrate | (Lu,Y)AG | |
| Light scattering layer | $ZrO_2$ | 500 |
| Filter layers | $SiO_2$ | 52.05 |
| | $ZrO_2$ | 17.64 |
| | $SiO_2$ | 122.5 |
| | $ZrO_2$ | 10.48 |
| | $SiO_2$ | 121.89 |
| | $ZrO_2$ | 22.68 |
| | $SiO_2$ | 81.35 |
| | $ZrO_2$ | 44.78 |
| | $SiO_2$ | 45.41 |
| | $ZrO_2$ | 71.52 |
| | $SiO_2$ | 54.92 |
| | $ZrO_2$ | 37.27 |
| | $SiO_2$ | 109.31 |
| | $ZrO_2$ | 36.4 |
| | $SiO_2$ | 65.14 |
| | $ZrO_2$ | 67.22 |
| | $SiO_2$ | 42.69 |
| | $ZrO_2$ | 53.71 |
| | $SiO_2$ | 100.49 |
| | $ZrO_2$ | 16.02 |
| Exit medium | Silicone | |
| Total Thickness | | 1673.47 |

TABLE IV setup of Example IV

| Layer | Material | Thickness (nm) |
|---|---|---|
| Substrate | Glass | |
| Light scattering layer | $Y_2O_3$ | 400 |
| Filter layers | $SiO_2$ | 92.05 |
| | $Y_2O_3$ | 20.68 |
| | $SiO_2$ | 87.54 |
| | $Y_2O_3$ | 38.43 |
| | $SiO_2$ | 67.65 |
| | $Y_2O_3$ | 48.46 |
| | $SiO_2$ | 77.37 |
| | $Y_2O_3$ | 55.07 |
| | $SiO_2$ | 60.54 |
| | $Y_2O_3$ | 64.41 |
| | $SiO_2$ | 75.77 |
| | $Y_2O_3$ | 52.5 |
| | $SiO_2$ | 79.27 |
| | $Y_2O_3$ | 64.38 |
| | $SiO_2$ | 64.97 |
| | $Y_2O_3$ | 63.19 |
| | $SiO_2$ | 67.28 |
| | $Y_2O_3$ | 53.26 |
| | $SiO_2$ | 115.33 |
| | $Y_2O_3$ | 18.1 |
| Exit medium | Silicone | |
| Total Thickness | | 1666.26 |

TABLE V setup of Example V

| Layer | Material | (Thickness nm) |
|---|---|---|
| Substrate | (Lu,Y)AG | |
| Light scattering layer | $TiO_2$ | 500 |
| Filter layers | $SiO_2$ | 29.96 |
| | $TiO_2$ | 14.53 |
| | $SiO_2$ | 98.63 |
| | $TiO_2$ | 11.08 |
| | $SiO_2$ | 112.71 |
| | $TiO_2$ | 17.95 |
| | $SiO_2$ | 77.97 |
| | $TiO_2$ | 36.29 |
| | $SiO_2$ | 46.21 |
| | $TiO_2$ | 54.17 |
| | $SiO_2$ | 51.27 |
| | $TiO_2$ | 31.26 |
| | $SiO_2$ | 111.22 |
| | $TiO_2$ | 25.66 |
| | $SiO_2$ | 76.1 |
| | $TiO_2$ | 46.09 |
| | $SiO_2$ | 50.04 |
| | $TiO_2$ | 42.04 |
| | $SiO_2$ | 93.11 |
| | $TiO_2$ | 13.94 |
| Exit medium | Silicone | |
| Total Thickness | | 1540.23 |

TABLE VI setup of Example VI

| Layer | Material | Thickness (nm) |
|---|---|---|
| Substrate | (Lu,Y)AG | |
| Light scattering layer | $Ta_2O_5$ | 500 |
| Filter layers | $SiO_2$ | 37.18 |
| | $Ta_2O_5$ | 31.19 |
| | $SiO_2$ | 96.53 |
| | $Ta_2O_5$ | 14.37 |
| | $SiO_2$ | 128.6 |
| | $Ta_2O_5$ | 9.3 |
| | $SiO_2$ | 114.56 |
| | $Ta_2O_5$ | 30.44 |
| | $SiO_2$ | 75.92 |
| | $Ta_2O_5$ | 48.42 |
| | $SiO_2$ | 57.06 |
| | $Ta_2O_5$ | 57.19 |

TABLE VI-continued setup of Example VI

| Layer | Material | Thickness (nm) |
|---|---|---|
| | $SiO_2$ | 74.61 |
| | $Ta_2O_5$ | 31.46 |
| | $SiO_2$ | 118.22 |
| | $Ta_2O_5$ | 32.8 |
| | $SiO_2$ | 54.68 |
| | $Ta_2O_5$ | 186.03 |
| | $SiO_2$ | 84.62 |
| | $Ta_2O_5$ | 13.88 |
| Exit medium | Silicone | |
| Total Thickness | | 1797.06 |

TABLE VII setup of Example VII

| Layer | Material | Thickness (nm) |
|---|---|---|
| Substrate | (Lu,Y)AG | |
| Light scattering layer | $HfO_2$ | 500 |
| Filter layers | $SiO_2$ | 59.05 |
| | $HfO_2$ | 19.38 |
| | $SiO_2$ | 120.6 |
| | $HfO_2$ | 12.7 |
| | $SiO_2$ | 114.6 |
| | $HfO_2$ | 26.99 |
| | $SiO_2$ | 80.72 |
| | $HfO_2$ | 47.95 |
| | $SiO_2$ | 50.33 |
| | $HfO_2$ | 67.68 |
| | $SiO_2$ | 62.53 |
| | $HfO_2$ | 41.38 |
| | $SiO_2$ | 99.79 |
| | $HfO_2$ | 46.86 |
| | $SiO_2$ | 55.31 |
| | $HfO_2$ | 71.5 |
| | $SiO_2$ | 47.35 |
| | $HfO_2$ | 51.63 |
| | $SiO_2$ | 110.86 |
| | $HfO_2$ | 15.08 |
| Exit medium | Silicone | |
| Total Thickness | | 1702.29 |

TABLE VIII setup of Example VIII

| Layer | Material | Thickness (nm) |
|---|---|---|
| Substrate | (Lu,Y)AG | |
| Light scattering layer | $Nb_2O_5$ | 500 |
| Filter layers | $Al_2O_3$ | 74.42 |
| | $Nb_2O_5$ | 12.1 |
| | $Al_2O_3$ | 98.39 |
| | $Nb_2O_5$ | 12.9 |
| | $Al_2O_3$ | 108.4 |
| | $Nb_2O_5$ | 17.27 |
| | $Al_2O_3$ | 77.15 |
| | $Nb_2O_5$ | 32.79 |
| | $Al_2O_3$ | 69.6 |
| | $Nb_2O_5$ | 42.1 |
| | $Al_2O_3$ | 47.49 |
| | $Nb_2O_5$ | 53.72 |
| | $Al_2O_3$ | 72.76 |
| | $Nb_2O_5$ | 28.69 |
| | $Al_2O_3$ | 88.87 |
| | $Nb_2O_5$ | 39.45 |
| | $Al_2O_3$ | 58.57 |

TABLE VIII-continued setup of Example VIII

| Layer | Material | Thickness (nm) |
|---|---|---|
| | $Nb_2O_5$ | 45.45 |
| | $Al_2O_3$ | 103.79 |
| | $Nb_2O_5$ | 9.58 |
| Exit medium | Silicone | |
| Total Thickness | | 1593.49 |

TABLE IX setup of Example IX

| Layer | Material | Thickness (nm) |
|---|---|---|
| Substrate | (Lu,YAG) | |
| Light scattering layer | $SiO_2$ | 400 |
| Filter layers | $Nb_2O_5$ | 21.16 |
| | $SiO_2$ | 92.98 |
| | $Nb_2O_5$ | 11.69 |
| | $SiO_2$ | 127.85 |
| | $Nb_2O_5$ | 7.82 |
| | $SiO_2$ | 117.87 |
| | $Nb_2O_5$ | 22.37 |
| | $SiO_2$ | 71.8 |
| | $Nb_2O_5$ | 42.3 |
| | $SiO_2$ | 46.24 |
| | $Nb_2O_5$ | 49.63 |
| | $SiO_2$ | 69.84 |
| | $Nb_2O_5$ | 24.68 |
| | $SiO_2$ | 132 |
| | $Nb_2O_5$ | 24.15 |
| | $SiO_2$ | 57.98 |
| | $Nb_2O_5$ | 159.48 |
| | $SiO_2$ | 73.98 |
| | $Nb_2O_5$ | 12.95 |
| Exit medium | Silicone | |
| Total Thickness | | 1566.77 |

The invention claimed is:

1. A light emission diode (LED) assembly, comprising:
   a LED die,
   a phosphor layer,
   a filter layer, and
   a light scattering layer; wherein:
      the light scattering layer comprises a material that:
         is substantially transparent,
         has a thickness between 300 nm and 800 nm, and
         the light scattering layer has a refractive index that differs from refractive indexes of the filter layer disposed on a first surface of the light scattering layer and the phosphor layer disposed on a second surface of the light scattering layer by at least 0.2; and
      a product of the thickness of the light scattering layer and the refractive index of the light scattering layer is less than or equal to 1900 nm and greater than or equal to 400 nm.

2. The LED assembly of claim 1, wherein the product of the thickness of the light scattering layer and the refractive index of the light scattering layer is less than or equal to 1400 nm and greater than or equal to 1000 nm.

3. The LED assembly of claim 1, wherein the material of the light scattering layer is selected from the group consisting of inorganic oxides and mixtures thereof.

4. The LED assembly according to claim 1, whereby the thickness of the light scattering layer is less than or equal to 700 nm and greater than or equal to 400 nm.

5. The LED assembly according to claim 1, whereby the filter layer comprises a dielectric layer, the dielectric layer comprising alternating sub-layers of low and high refractive index materials.

6. A system comprising a LED assembly according to claim 1, the system being used in one or more of the following applications:
- office lighting systems,
- household application systems,
- shop lighting systems,
- home lighting systems,
- accent lighting systems,
- spot lighting systems,
- theater lighting systems,
- fiber-optics application systems,
- projection systems,
- self-lit display systems,
- pixelated display systems,
- segmented display systems,
- warning sign systems,
- medical lighting application systems,
- indicator sign systems,
- decorative lighting systems,
- portable systems,
- automotive applications, and
- green house lighting systems.

7. The LED assembly of claim 2, wherein the material of the light scattering layer is selected from the group consisting of inorganic oxides and mixtures thereof.

8. The LED assembly of claim 1, wherein the material of the light scattering layer is selected from the group consisting of $ZrO_2$, $Y_2O$, $Ta_2O_5$, $Nb_2O_5$, $SiO_2$, $TiO_2$, $Al_2O_3$, $HfO_2$ and mixtures thereof.

9. The LED assembly of claim 2, wherein the material of the light scattering layer is selected from the group consisting of $ZrO_2$, $Y_2O$, $Ta_2O_5$, $Nb_2O_5$, $SiO_2$, $TiO_2$, $Al_2O_3$, $HfO_2$ and mixtures thereof.

10. The LED assembly according to claim 1, whereby the thickness of the light scattering layer is less than or equal to 600 nm and greater than or equal to 500 nm.

11. The LED assembly of claim 1, wherein the refractive index of the light scattering layer is at least 0.2 greater than the refractive index of the filter layer that is adjacent the surface of the light scattering layer.

\* \* \* \* \*